(12) United States Patent
Brassfield et al.

(10) Patent No.: US 12,347,603 B2
(45) Date of Patent: Jul. 1, 2025

(54) MOLDED INDUCTOR WITH MAGNETIC CORE HAVING MOLD FLOW ENHANCING CHANNELS

(71) Applicant: Texas Instruments Incorporated, Dallas, TX (US)

(72) Inventors: Joel Nathan Brassfield, Homer Glen, IL (US); Charles Allen DeVries, Jr., Winfield, IL (US); Kristen Nguyen Parrish, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1709 days.

(21) Appl. No.: 16/235,454

(22) Filed: Dec. 28, 2018

(65) Prior Publication Data

US 2020/0211760 A1  Jul. 2, 2020

(51) Int. Cl.
*H01F 27/24* (2006.01)
*H01F 27/02* (2006.01)
(Continued)

(52) U.S. Cl.
CPC ....... *H01F 27/2852* (2013.01); *H01F 27/022* (2013.01); *H01F 27/06* (2013.01); *H01F 27/24* (2013.01); *H01F 27/366* (2020.08); *H01F 41/005* (2013.01); *H01F 41/061* (2016.01); *H01L 21/561* (2013.01); *H01L 23/3121* (2013.01); *H01L 23/49537* (2013.01); *H01L 23/552* (2013.01); *H01L 25/16* (2013.01); *H02M 1/08* (2013.01)

(58) Field of Classification Search
CPC .... H01F 27/2852; H01F 27/022; H01F 27/06; H01F 27/24; H01F 27/366; H01F 41/005; H01F 41/061; H01F 27/40; H01F 2017/048; H01F 17/045; H01F 41/0246; H01L 21/561; H01L 23/3121; H01L 23/49537; H01L 23/552; H01L 25/16; H01L 23/645; H01L 2224/16227; H01L 2224/73204; H01L 2924/15313; H01L 2924/3025; H02M 1/08; H02M 3/003
See application file for complete search history.

(56) References Cited

U.S. PATENT DOCUMENTS 4,425,702 A * 1/1984 Murakami ............ H01F 17/045
                                                       29/605
8,723,629 B1 * 5/2014 Liu ..................... H01F 27/022
                                                       336/212
(Continued)

FOREIGN PATENT DOCUMENTS

JP       2019197804 A *  11/2019  ........... H01F 27/255

*Primary Examiner* — Mang Tin Bik Lian
(74) *Attorney, Agent, or Firm* — Ronald O. Neerings; Frank D. Cimino

(57) ABSTRACT

A molded inductor includes a winding having leads configured for attaching leads of the winding to pads on a package substrate, having a magnetic core with a body disposed within the winding, wherein the magnetic core has at least one mold flow enhancing feature that enhances a filling of a magnetic mold material as compared to a filling provided by a uniform cylindrical body. The magnetic mold material encases the winding and the magnetic core to form either a standalone discrete inductor component, or the magnetic component of an output filter of an integrated switching power converter module.

26 Claims, 9 Drawing Sheets

(51) Int. Cl.

| | |
|---|---|
| *H01F 27/06* | (2006.01) |
| *H01F 27/28* | (2006.01) |
| *H01F 27/36* | (2006.01) |
| *H01F 41/00* | (2006.01) |
| *H01F 41/061* | (2016.01) |
| *H01L 21/56* | (2006.01) |
| *H01L 23/31* | (2006.01) |
| *H01L 23/495* | (2006.01) |
| *H01L 23/552* | (2006.01) |
| *H01L 25/16* | (2023.01) |
| *H02M 1/08* | (2006.01) |

(56) References Cited

U.S. PATENT DOCUMENTS

| | | | | |
|---|---|---|---|---|
| 10,141,104 | B2* | 11/2018 | Habraken | H01F 38/14 |
| 2011/0228507 | A1* | 9/2011 | Yin | H05K 1/18 |
| | | | | 361/811 |
| 2011/0242775 | A1* | 10/2011 | Schaible | H01F 17/04 |
| | | | | 361/752 |
| 2011/0267163 | A1* | 11/2011 | Gerfer | H01R 13/6658 |
| | | | | 336/92 |
| 2014/0002227 | A1* | 1/2014 | Hsieh | H01F 5/00 |
| | | | | 336/200 |
| 2015/0325357 | A1* | 11/2015 | Yamaguchi | H01F 27/02 |
| | | | | 336/83 |
| 2016/0217919 | A1* | 7/2016 | Iwata | H01F 27/29 |
| 2016/0233772 | A1 | 8/2016 | Renauer et al. | |
| 2016/0247626 | A1* | 8/2016 | Kawarai | H01F 27/2823 |
| 2017/0229232 | A1* | 8/2017 | Takagi | H01F 27/306 |
| 2019/0348211 | A1* | 11/2019 | Ashizawa | H01F 27/2852 |
| 2020/0194161 | A1* | 6/2020 | Hu | H01F 27/40 |

\* cited by examiner

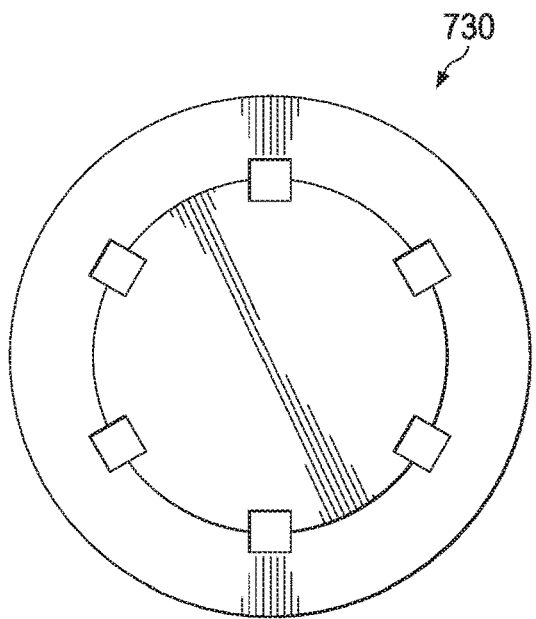
FIG. 7I
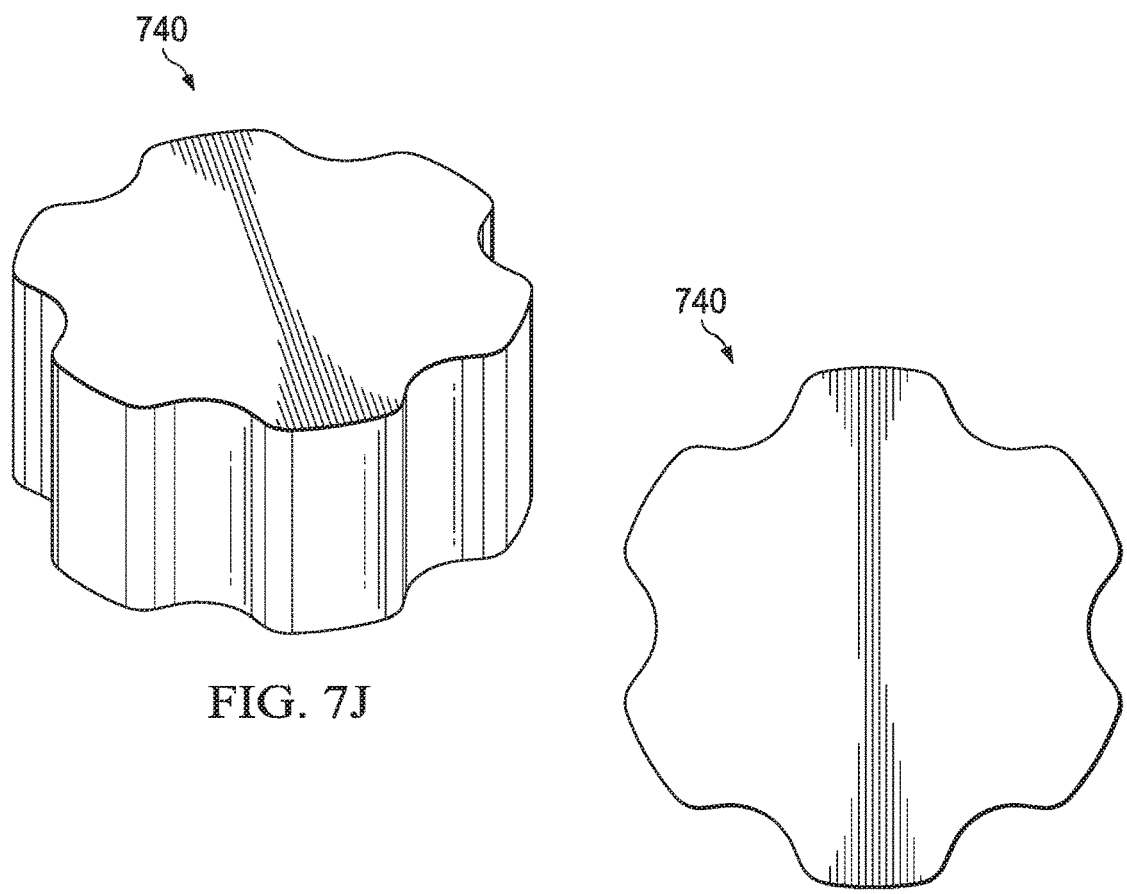
FIG. 7J
FIG. 7K

MOLDED INDUCTOR WITH MAGNETIC CORE HAVING MOLD FLOW ENHANCING CHANNELS

CROSS-REFERENCE TO COPENDING APPLICATIONS

This application has subject matter related to patent application Ser. No. 15/855,706 entitled "SWITCH-MODE CONVERTER MODULE" that was filed on Dec. 27, 2017.

FIELD

This Disclosure relates to molded inductors and semiconductor packages having molded inductors.

BACKGROUND

Inductors have a wide variety of applications in electronics. For example, inductors are used for high power applications, noise suppression, radio frequency circuits, signal processing, and isolation circuits. To meet the needs of these diverse applications several types of inductors have been developed that are available in a variety of form factors.

Molded inductors are inductors that are molded into a plastic or a ceramic housing. Generally, these inductors have a cylindrical or bar form factor body that can have several different types of winding. The magnetic molding material of the inductor body is generally comprised of a powdered magnetic material, a resin, and a lubricant, where the combination can be used for pressure molding. The molded inductor has a first lead and a second lead that enables mounting on a substrate such as on a printed circuit board (PCB) or on a leadframe.

An example of semiconductor packages having inductors, that can be molded inductors, is a switch-mode power supply (also known as a switch-mode converter) which is an electronic circuit that converts an input voltage or current into one or more output voltages or currents that are higher or lower in magnitude than the input level. For example, a switch-mode power supply that generates an output voltage lower than the input voltage is termed a buck or step-down converter. A switch-mode power supply that generates an output voltage that is higher than the input voltage is termed a boost or step-up converter. These are only examples, with additional switch mode converter topologies known that utilize inductors.

A typical switch-mode power supply includes a switch for alternately opening and closing a current path through an inductor in response to a switching signal. In operation, a voltage is applied across the inductor. Electrical energy is transferred to a load connected to the inductor by alternately opening and closing the switch as a function of the switching signal. The amount of electrical energy transferred to the load is a function of the duty cycle of the switch and the frequency of the switching signal. Switch-mode power supplies are widely used to power electronic devices, particularly battery-powered devices, such as portable cellular phones, laptop computers, and other electronic systems in which efficient use of power is desirable.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes the problem of high cost and large size for power supply modules, including switch-mode power supplies using discrete inductors, or AC power supplies, or power conversion products, because of limited discrete magnetic options is largely solved by manufacturing a IC with integrated coils (windings) with high permeability cores (greater than air) and being overmolded with a magnetic mold material. This Disclosure however further recognizes that there may be voids formed in the magnetic mold material between the magnetic core and the winding, particularly (but not only when) the magnetic core includes a flange over a body region that is positioned within the winding. Moreover, there is concern that the build-up of pressure beneath the magnetic core from the magnetic mold material during molding may not match the pressure at the top of the magnetic core, which can lead to the magnetic core lifting or rising, which can also cause magnetic mold material fill issues on the top of the power module package.

This Disclosure solves these above-described problems by creating a magnetic core that has at least one mold flow enhancing feature which enhances mold flow which provide path(s) for magnetic mold material to flow that encourages mold material to flow in tight areas around the magnetic core where there may be a concern about mold voiding, particularly when using transfer molding which lacks the relatively high pressure used in compression molding. The mold flow enhancing feature(s) that provide additional mold flow paths do not sacrifice the mechanical integrity of the magnetic core, do not significantly lower the amount of magnetic volume that is allotted to the magnetic core, or create additional pick and place issues for the placing the body of the magnetic core inside the winding.

BRIEF DESCRIPTION OF THE DRAWINGS

Reference will now be made to the accompanying drawings, which are not necessarily drawn to scale, wherein:

FIGS. 7A-M depict example magnetic cores having at least one mold flow enhancing feature for enhancing the flow of magnetic mold material during molding, with various views provided.

DETAILED DESCRIPTION

Figure 1:
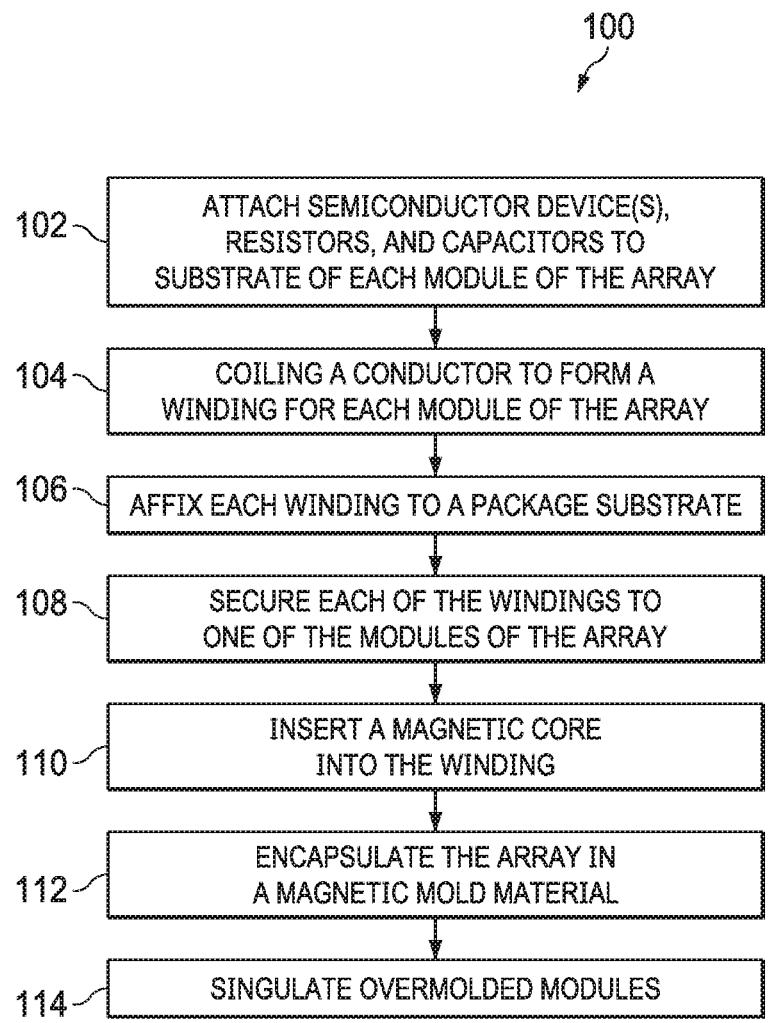
FIG. 1 shows a flow diagram for a method for manufacturing a switch-mode converter module including a molded inductor comprising a magnetic core having at least one mold flow enhancing feature for enhancing the flow of magnetic mold material, in accordance with one example method.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Like many electronic systems, it is desirable to improve switch-mode converters by reducing the cost and size of the converter module while improving or at least maintaining the converter performance. The inductors used in a switch-mode converter tend to limit reductions in module size and cost, as the magnetic components are often the largest and most expensive of the electronic components used to implement the power converter. Switch-mode power converter modules may be encapsulated in a molding compound, with a minimum spacing between components of the module and the exterior surface of the encapsulation dictated by the requirements of the tooling applied to encapsulate the switch-mode power converter. Accordingly, to achieve a desired module size, the physical size of the inductor is limited, and conversely, the physical size of the inductor may dictate the size of the power converter module. For example, in some switch-mode power converter modules, the size of the inductor may be limited to no more than 60% of the total module size, which either limits the power converter performance or requires an increase in power converter module size to improve inductor performance.

This Disclosure includes a method for manufacturing a switch-mode converter module comprising a molded inductor including a magnetic core having at least one mold flow enhancing feature for enhancing the flow of magnetic mold material. Disclosed mold flow enhancing features allow the inductor to occupy a greater percentage of the total power converter module volume while also reducing the cost to manufacture the switch-mode converter module, which helps avoid voids in the magnetic mold material, particularly under a flange of a magnetic core. In the manufacturing methods disclosed herein, switch-mode converter modules are generally manufactured in an array that includes a plurality of switch-mode converter modules. Each switch-mode converter module of an array includes a substrate (a leadframe or a PCB) on which electronic components are mounted. Semiconductor devices and passive components (other than magnetics) are first affixed to the substrate, and thereafter a winding is disposed atop the previously mounted components and affixed to the substrate. A magnetic core having at least one mold flow enhancing feature for enhancing the flow of magnetic mold material is inserted into each of the windings. The magnetic core serves to enhance the electrical performance of the integrated inductor, and can also reduce the cost of the final product by replacing magnetic mold material in the volume.

The entire array of electronic components, including the windings, the magnetic cores and the semiconductor device(s) including at least a controller IC are encapsulated in a magnetic mold material after attachment to the substrate. After encapsulation, the switch-mode converter modules are singulated. Implementations of this Disclosure allow for an increase in the size of the inductor which provides an performance improvement relative to the module as a whole by encapsulating the entirety of the module in magnetic mold material, rather than encapsulating the winding in magnetic material and encasing the module overall in a different material. Module manufacturing cost is also reduced by a reduction in inductor cost and production of modules in an array.

FIG. 1 shows a flow diagram for method 100 for manufacturing a switch-mode converter module in accordance with an example method. Though depicted sequentially as a matter of convenience, at least some of the actions shown can be performed in a different order and/or performed in parallel. Additionally, some implementations may perform only some of the actions shown.

In block 102, an array of switch-mode converter modules is manufactured. A plurality of module substrates (also referred to as module bases) are arranged in an array. The array may be one-dimensional or two-dimensional. For example, a plurality of module substrates may be formed on a sheet of substrate material such as a PCB. In some other implementations, the module substrate may include a leadframe, laminate material, ceramic material, or other metal/dielectric arrangement that provides electrically conductive connections for electronic components of the switch-mode converter and terminals for connection of the switch-mode converter module to an external device or circuit.

Semiconductor devices, resistors, and/or capacitors of the switch-mode converter are attached to pads on the surface of the substrate of each switch-mode converter module being manufactured. For example, if an 8×8 array of switch-mode converter modules is being manufactured, then one or more power supply switching components (e.g., power supply controller integrated circuits, or switching transistors) and associated resistors, capacitors, etc. may be attached to each of the 64 module substrates of the 8×8 array. The components may be affixed to pads on the surface of the module substrate by solder paste, electrically conductive adhesive, or other adhesive material suitable for attaching electronic components to a substrate.

Figure 2:
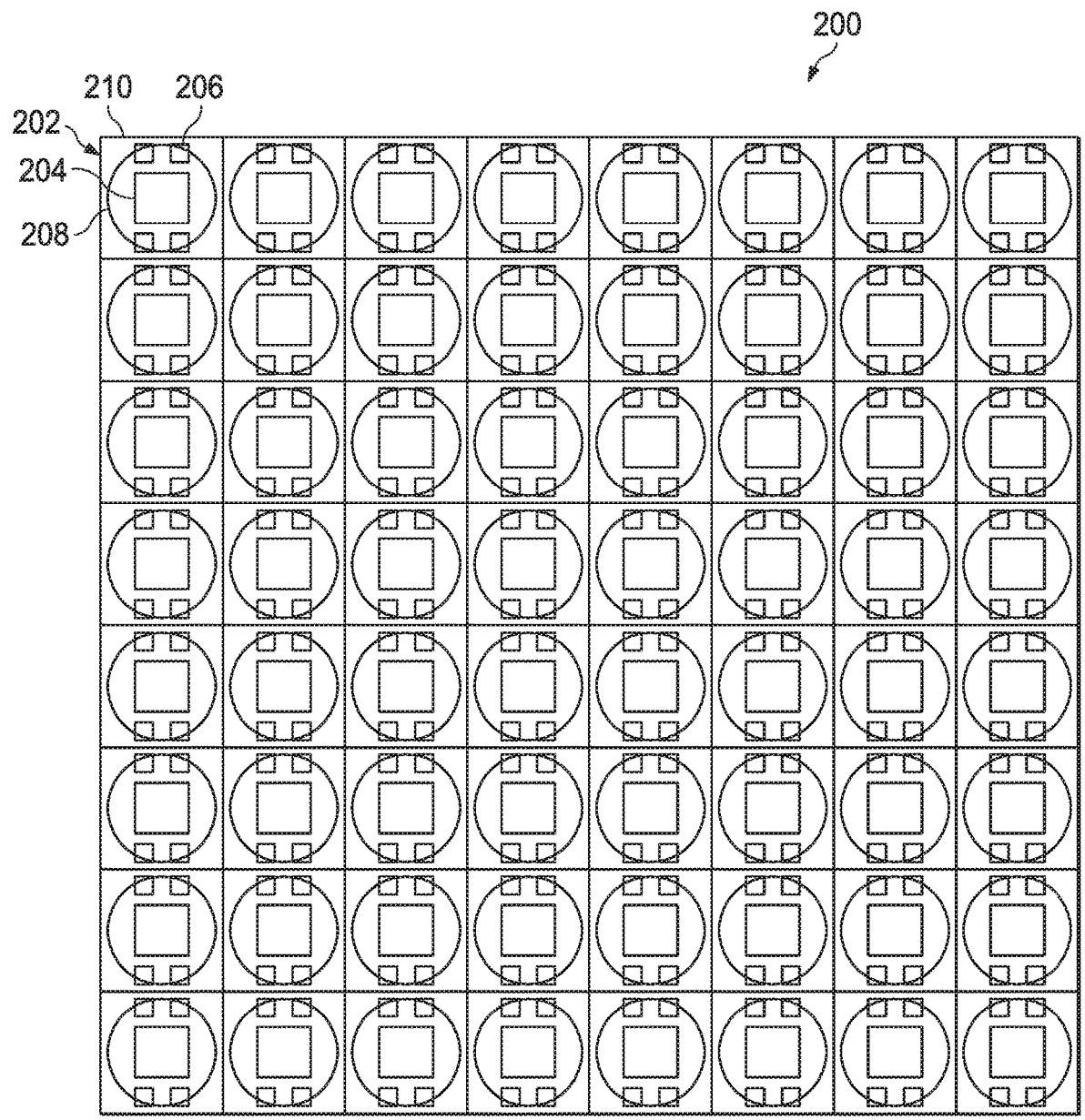
FIG. 2 shows an array of switch-mode converter modules including a molded inductor comprising magnetic core having at least one mold flow enhancing feature for enhancing the flow of magnetic mold material, in accordance with one example.

FIG. 2 shows an array 200 of switch-mode converter modules in accordance with an example. In FIG. 2, the module array 200 includes 64 switch-mode converter modules 202. Other implementations of the module array 200 may include a different number of switch-mode converter modules 202. Each switch-mode converter module 202 includes a module substrate 210 which may also be called a package substrate, one or more power supply switching components (e.g., a power supply controller 204 and/or discrete transistors) and various other electronic components 206 (e.g., resistors, capacitors, etc.) that are attached to the module substrate 210 in block 102. The power supply controller 204 and/or other electronic components 206 may generally be provided in any surface mount package, and include terminals (e.g., bumps, posts, pins, etc.) that are soldered to pads on the surface of the module substrate 210. The power supply controller 204 can be mounted to the module substrate 210 using a flip chip connection, wirebond, Wafer Level Chip Scale Package (WCSP), or a packaged device. In block 104, a winding corresponding to each of the switch-mode converter modules 202 is formed by coiling an electrical conductor. The conductor may be an insulated round wire, an insulated rectangular wire, etc. For example, the conductor may be an insulated copper wire (e.g., enamel/polyimide/plastic coated copper). In various implementations, the winding may form an outer-outer coil, a round wire wound coil, a flat wire wound coil, a staple winding, or other type of winding.

Figure 4A:
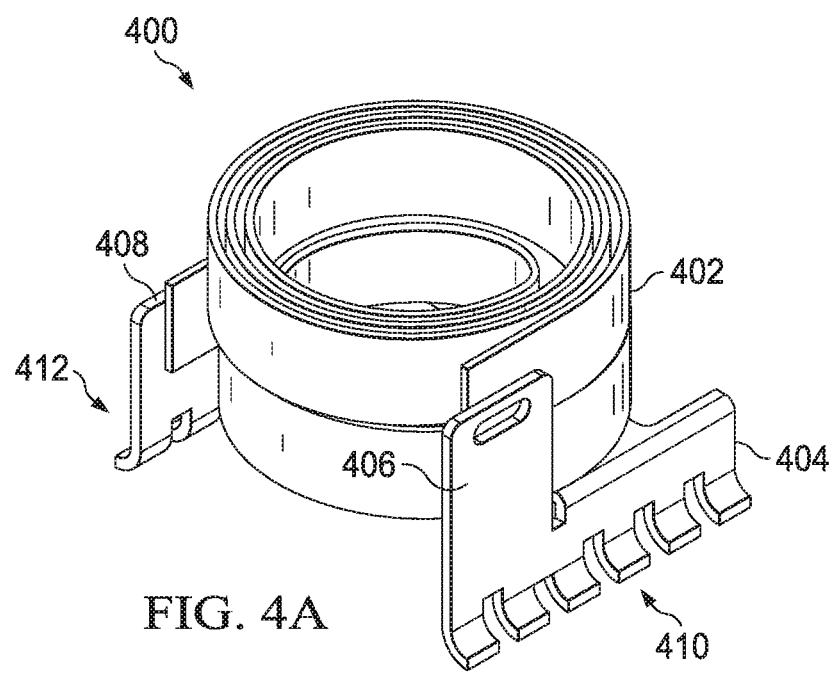
FIG. 4A shows a winding arrangement comprising a winding secured to a winding leadframe, in accordance with an example.

In block 106, each of the windings formed in block 104 is attached to a package substrate, such as a leadframe or PCB. FIG. 4A shows a winding arrangement 400 comprising a winding now shown as 402 secured to a winding leadframe 404 in accordance with an example. The winding 402 includes a rectangular (flat) insulated conductor coiled in an outer-outer configuration. A flat conductor is a conductor that has a width to length ratio greater than 1, and may be produced by flattening a round conductor. For example, a flat conductor may have a height that is two or more times greater than the thickness of the conductor. The winding leadframe 404 includes terminals 406 and 408 for conductively connecting the winding 402 to the winding leadframe 404. In some implementations, a first end (lead) of the winding 402 is welded or soldered to the terminal 408 and a second end (lead) of the winding 402 is welded or soldered to the terminal 406. The winding leadframe 404 also includes other terminals 410 and 412 for conductively connecting the leads of the winding 402 to the module substrate 210.

Figure 4B:
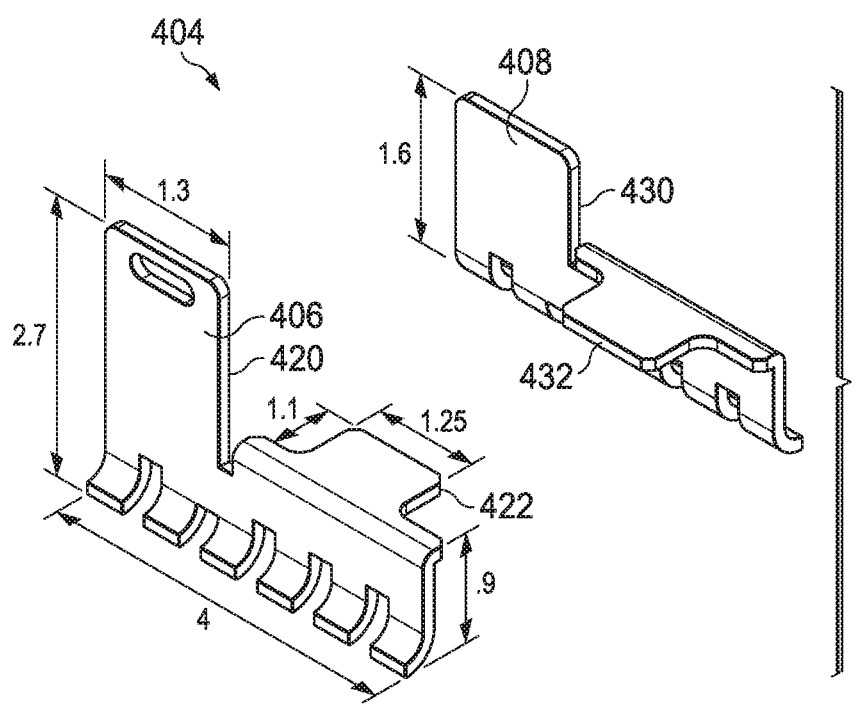
FIG. 4B shows a winding leadframe in accordance with an example.

FIG. 4B shows an example of winding leadframe 404. The winding leadframe 404 includes a first section 420 and a second section 430. The first section 420 and the second section 430 are similar in construction, with the exception that the terminal 406 is of greater height than the terminal 408. Various dimensions of the winding leadframe 404 are shown with respect to the first section 420. All dimensions shown are example dimensions in millimeters (mm). Illustrated dimensions (except the height of the terminal 406) are applicable to corresponding features of the second section 430. The winding leadframe 404 may be formed of copper (e.g., about 0.127 mm thick copper). The first section includes a projection 422 that extends generally normally relative to the terminal 406. The second section 430 includes a projection 432 that extends generally normally relative to the terminal 408. The winding 402 rests on and is supported by the projections 422 and 432. Other implementations of the winding leadframe 404 may have different dimensions than those shown in FIG. 4B.

In block 108, a winding 208 is secured to each of the module substrates 210. In some implementations, the winding 208 is secured to the module substrate 210 by attaching a winding leadframe to which the winding is secured to the module substrate 210. For example, the winding leadframe 404, to which the winding 402 is mounted, may be attached to the module substrate 210. The winding 402 is an implementation of the winding 208. In some implementations, the winding 208 is not attached to a leadframe, and the winding 208 is secured to the module substrate 210 without a winding leadframe. The winding 208 may be secured and conductively coupled to the module substrate 210 by solder paste, conductive adhesive, or other adhesive substance suitable for attaching the winding 208 to the module substrate 210. Securing the winding 208 to the module substrate 210 couples the winding 208 to the power supply controller 204 (or other power supply switching component), so that in operation the power supply controller 204 can control the flow of current in the winding 208, e.g., the power supply controller 204 may drive the winding 208.

Figure 3:
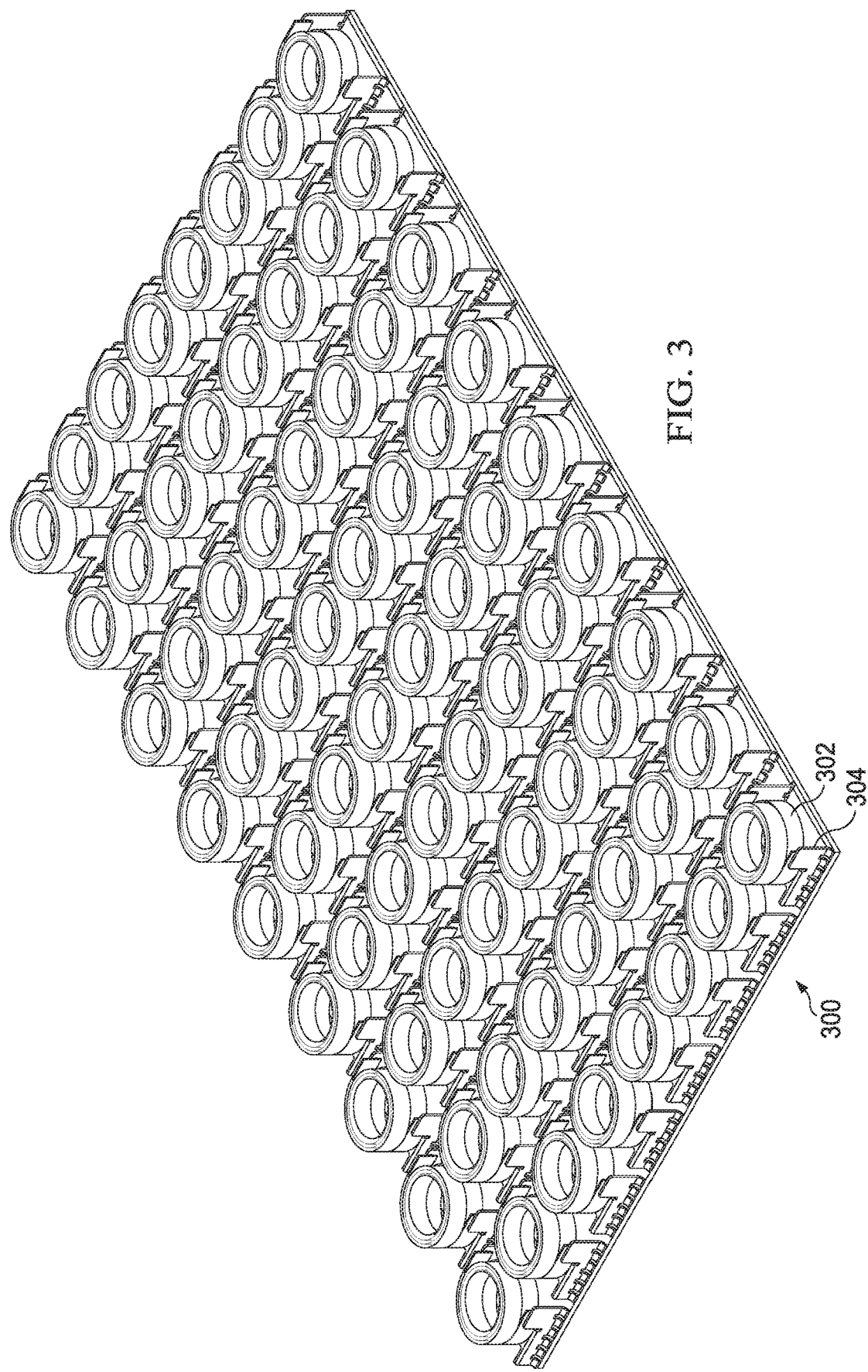
FIG. 3 shows an array of windings for attachment to a module substrate array in accordance with an example.

In some implementations, windings 208 may be simultaneously secured to multiple instances of the module substrate 210. For example, FIG. 3 shows an array 300 of windings 302 for attachment to a module substrate array in accordance with various examples. The array 300 includes a two-dimensional array of winding leadframes 304, and a winding 302 mounted to each winding leadframe 304. The array 300 may be secured to the module array 200 to secure a winding 302 to each of the module substrates 210. The winding 302 is an implementation of the winding 208. The array 300 may be manufactured by conductively connecting a winding 302 to each winding leadframe 304 of the array 300.

In block 110, a magnetic core having channel(s) is inserted into each of the windings. The magnetic core is formed of a material with high magnetic permeability that confines the magnetic field produced by current flow in the winding 208. The magnetic cores can be formed by cavity press molding, which allows for forming fine features. The body of the magnetic core having flow channel(s) may be inserted in the winding 208 before or after the winding 208 is secured to the module substrate 210.

In block 112, the module array 200, or at least one side thereof is encapsulated in a magnetic mold material. All sides of the module array 200 can be encapsulated, or there can be a molding solution where there is a partially molded package. The module array being molded on at least one side thereof refers to a substrate type of molding such as quad-flat no-leads (QFN) or ball grid array (BGA), vs. a multi-sided molding which would general be used with a small outline transistor (SOT) package. For example, the magnetic mold material applied to encapsulate the module array 200 may include a polymer, monomer, or other material and may be made by pelletizing a fine powder of a mixture of resin, filler, hardener, catalyst, carbon black, and other materials. The magnetic mold material also includes a ferromagnetic material, in the form of particles that are dispersed throughout the mold compound, that enhances the operation of (e.g., by increasing the inductance of) the winding 208. The ferromagnetic material may be sendust, which is approximately 85% iron, 9% silicon and 6% aluminum and has a relative permeability of up to 140,000. The above-described materials are mixed together and then formed into a powder. In some implementations, permalloy may be used as the ferromagnetic material. Permalloys may have different concentrations of nickel and iron. In one implementation, the permalloy comprises approximately 20% nickel and 80% iron. Variations of permalloy may change the ratios of nickel and iron to 45% nickel and 55% iron. Other ferromagnetic materials include molybdenum permalloy which is an alloy of approximately 81% nickel, 17% iron and 2% molybdenum. Copper may be added to molybdenum permalloy to produce supermalloy which has approximately 77% nickel, 14% iron, 5% copper, and 4% molybdenum. The use of fine particles of sendust or other ferromagnetic powder materials enables the ferromagnetic materials to flow with the molten mold compound around electronic components that are encapsulated during the molding process.

The magnetic mold material is in a powdered or solid form and is generally placed in a pot where heat and pressure are applied. The heat and pressure cause the magnetic mold material to transition into a fluid state. In the fluid state, the mold compound may be injected into a cavity to encapsulate the module array 200 or a portion thereof. The mold compound solidifies to form a hard casing. In addition to enhancing the operation of the winding 208, the magnetic mold material provides shielding from electromagnetic interference, and protects the electronic components of the switch-mode converter module 202 from the environment.

In block 114, the individual switch-mode converter modules 202 are singulated from the module array 200. The singulation may include sawing the encapsulated module array 200 along row and column boundaries that separate the individual switch-mode converter modules 202. In some examples, the singulation may include cutting through the magnetic mold material to separate one switch-mode converter module 202 from another. In other examples, the singulation may include cutting through the module substrate (e.g., a module leadframe) and not cutting through the magnetic mold material to separate one switch-mode converter module 202 from another.

Figure 5:
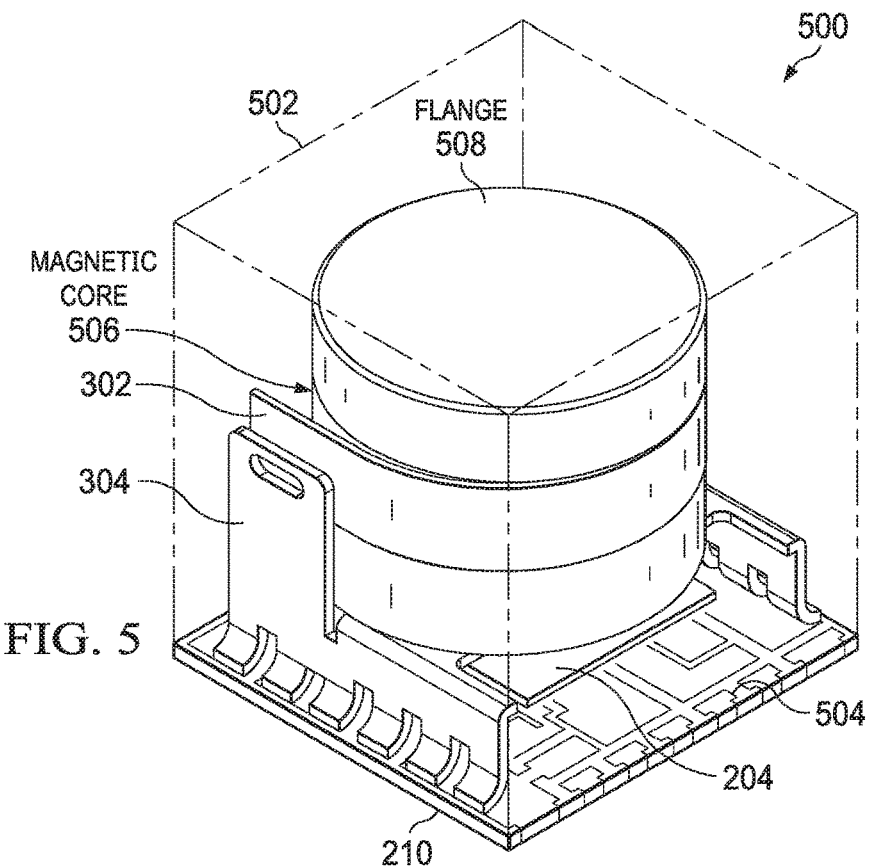
FIG. 5 shows a perspective view of an encapsulated switch-mode converter module including a molded inductor comprising a magnetic core having at least one mold flow enhancing feature for enhancing the flow of magnetic mold material, in accordance with an example.

FIG. 5 shows a perspective view of an encapsulated switch-mode converter module 500 after singulation of the switch-mode converter module 500 from an encapsulated module array 200 comprising a module substrate 210 as shown in FIG. 2. The switch-mode converter module 500 is an implementation of the switch-mode converter module 202. In the switch-mode converter module 500, the magnetic molding material 502 fully encases the electronic components of the switch-mode converter module 500 including providing a molded inductor comprising the winding now shown as 302, and the magnetic core 506 shown with an optional flange 508 having its body (body 507 shown in FIG. 6) inside the winding 302 all encased by the magnetic mold material 502. For example, the magnetic molding material 502 fills a volume that extends from a surface 504 of the module substrate 210 to beyond a top surface provided by its optional flange 508 of the magnetic core 506 that has a body 507 below the flange 508. In some implementations, the switch-mode converter module 500 may be about 4.5 mm in length, 4.5 mm in width, and 3.5 mm in height. In some implementations, the switch-mode converter module 500 may have different dimensions. The winding 302 may be about 2.2 mm in height and 4.2 mm in diameter. In some implementations, the winding 302 may have different dimensions.

The module substrate 210 may be a multi-layer laminate that includes in one or more layers of conductive traces (e.g., copper traces) separated by an insulator (e.g., an insulating film or resin). For example, the module substrate 210 may be constructed using PCB technology or can comprise a leadframe.

Figure 6:
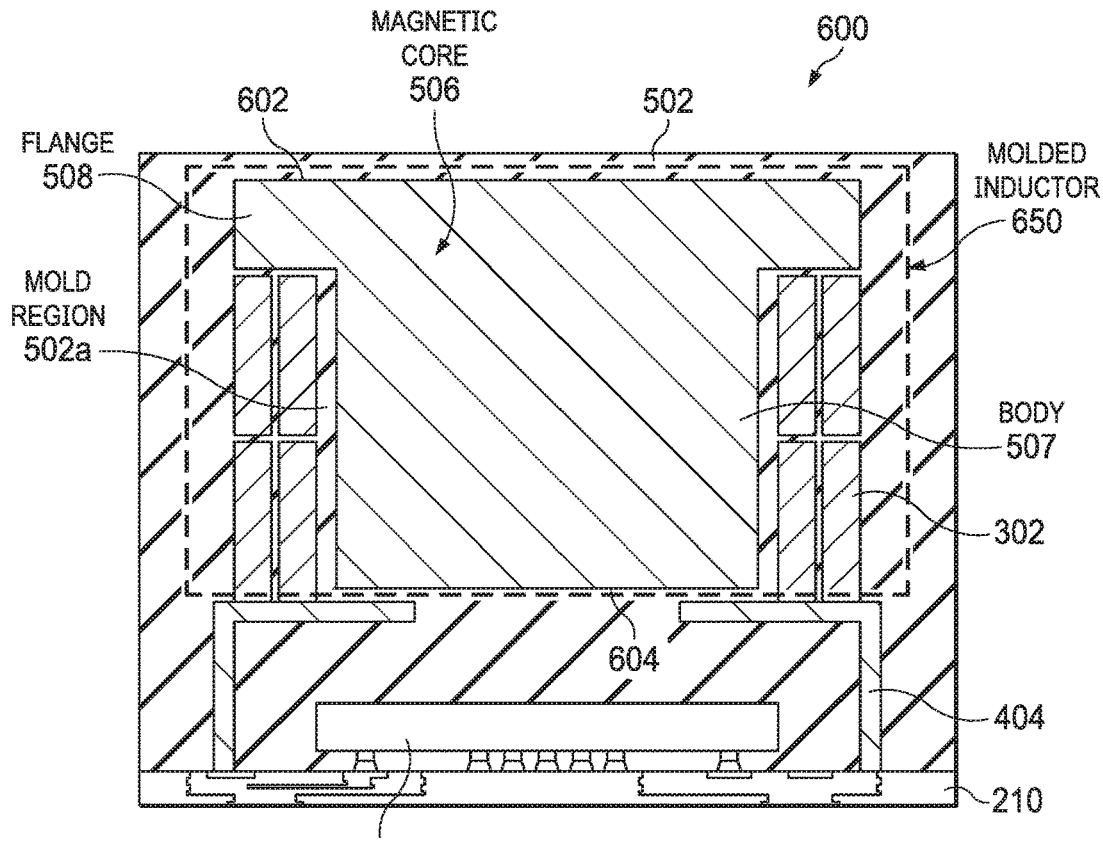
FIG. 6 shows a front cross-sectional view of the encapsulated switch-mode converter module shown in FIG. 5.

FIG. 6 shows a front cross-sectional view of the encapsulated switch-mode converter module 500 shown in FIG. 5 now shown as encapsulated switch-mode converter module 600 having a disclosed molded inductor now being identified as 650, in accordance with an example. The molded inductor 650 comprises a winding 302, the magnetic core 506 shown with an optional flange 508 having its body 507 inside the winding 302, all encased by the magnetic mold material 502. The magnetic core 506 has at least one mold flow enhancing feature that enhances a filling of a magnetic mold material as compared to a filling provided by a uniform cylindrical body, with example mold flow enhancing feature shown in FIGS. 7A-7M described below.

The switch-mode converter module 600 is an implementation of the switch-mode converter modules 202. In the switch-mode converter module 600, the power supply controller 204 is conductively coupled and attached to pads on the module substrate 210. The winding 302 is disposed above the power supply controller 204. That is, the power supply controller 204 is disposed between the module substrate 210 and the winding 302. The body 507 of the magnetic core 506 is disposed within the winding 302. In some implementations of the magnetic core 506, a diameter of a top end 602 of the magnetic core 506 is greater than a diameter of the bottom end 604 of the magnetic core 506. For example, the body 507 including its bottom end 604 is disposed within the winding 302, and the flange 508 including its top end 602 is disposed outside of the winding 302. The entirety of the winding 302, the magnetic core 506 and all electronic components attached to the module substrate 210 are encapsulated in the magnetic mold material 502. Magnetic mold material shown as mold region 502a can be seen to be in the gap between the body 507 and the winding 302 including under the flange 508. The mold flow enhancing feature(s) of disclosed magnetic cores 506 as described enhances a filling of the magnetic mold material 502 as compared to a filling provided by a uniform cylindrical body, particular when the magnetic core includes a flange, such as in the otherwise difficult to properly fill mold region 502a in the gap between the body 507 and the winding 302 under the flange 508.

In some implementations of a switch-mode converter module, the power supply controller 204, and/or other power supply switching component, passive components, etc., may be disposed on an opposite side of the module substrate 210 from the side of module substrate 210 on which the winding 208 is disposed. In some implementations of a switch-mode converter module, the power supply controller 204, and/or other power supply switching component, passive components, etc., may not be disposed between the module substrate 210 and the winding 208.

The flange 508 allows the magnetic core 506 to be fed by simple bowl-feed pick and place the body 507 into the center of the winding 208, without complex automatic optical inspection (AOI) or other alignment techniques, and the flange 508 holds the body 507 of the magnetic core 506 upright within the winding 208. If a compression mold is typically used to form the magnetic mold material 502, it is suspected that the mold material fills more evenly without issue including in the mold region 502a, even with large magnetic particles, so that nooks and crannies are not observed in cross sections or teardowns. However, with a transfer mold, issues are anticipated regarding completion of the mold fill, especially in mold region 502a, particularly at the top of the body 507 under the flange 508. In addition, there is concern that the build-up of pressure beneath the magnetic core 506 from the mold may not match the pressure on the top of the magnetic core 506, which may lead to the magnetic core 506 lifting or rising, which will cause magnetic mold material fill issues on the top of the package.

Although some alternate shapes for molded magnetic cores are known, they generally do nothing to address the mold concern issues described above. Typical magnetic cores are not used in transfer mold devices. So they are not needed except for the disclosed method of transfer molding arrays of devices to create the integrated magnetic in the package. Without disclosed mold flow enhancing feature(s), the transfer mold would tend to push up on the magnetic core 506, either displacing it, causing voids, or causing both of these problems.

Disclosed magnetic cores include mold flow enhancing feature(s), such as flow channels, instead of a basic cylindrical magnetic core design, to allow and encourage magnetic mold material during molding to flow in areas of the molded package, such as mold region 502a shown in FIG. 6 where there is special concern about mold voiding. Disclosed magnetic cores including mold flow enhancing feature(s) do not sacrifice the mechanical integrity of the magnetic core, significantly lowering the amount of magnetic volume that is allotted to the magnetic core, nor do they create any additional pick and place issues for magnetic cores. Disclosed methods are advantageous for both compression molding and transfer molding processes.

Figure 7A:
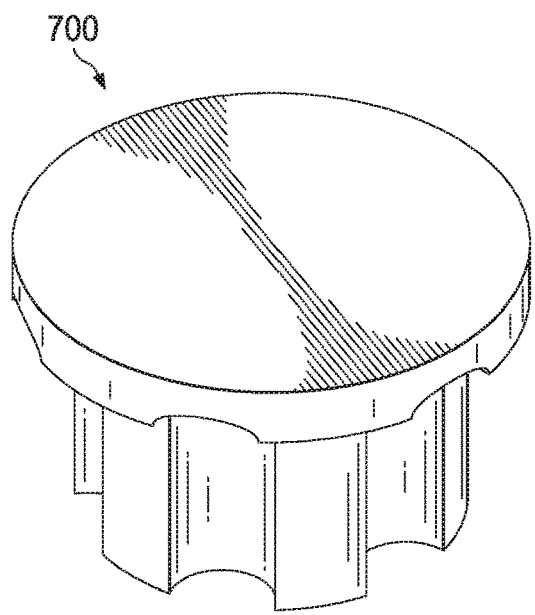
Figure 7C:
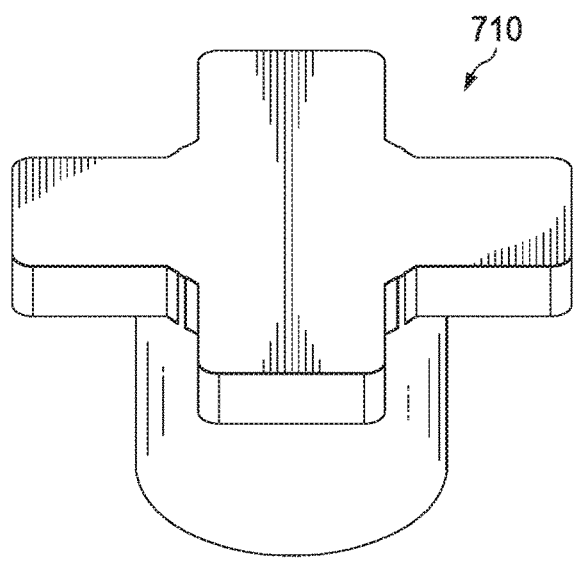
Figure 7B:
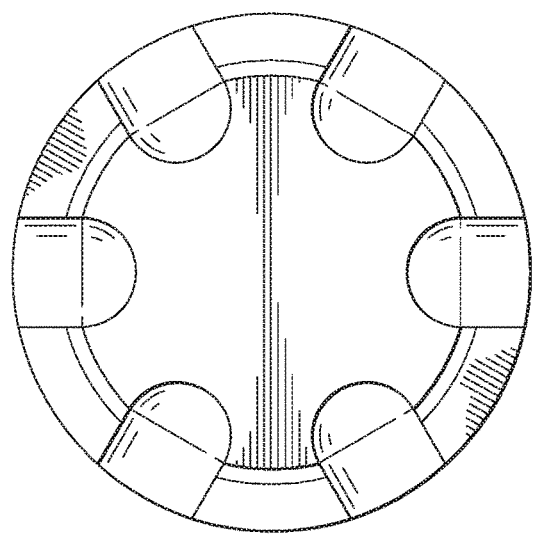

FIG. 7A shows a perspective view and FIG. 7B a top view of an example magnetic core 700 having a flange and at least one mold flow enhancing feature comprising side channels (or grooves) configured so that the magnetic mold material during molding can flow from the side of the flange through to the space around the outside of the body of the magnetic core 700. There is minimal volume reduction in the magnetic core, and this reduction can be reduced further by reducing the number of notches used. Identifying an ideal number of notches used will generally be determined by simulations or experiments to determine the extent of mold voiding.

Figure 7D:
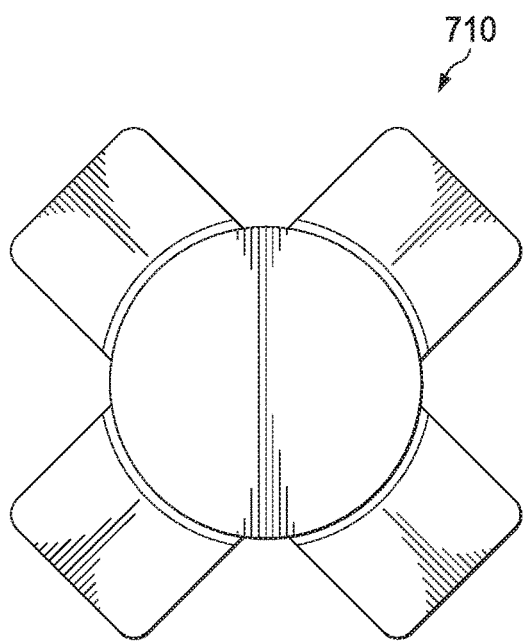
Figure 7E:
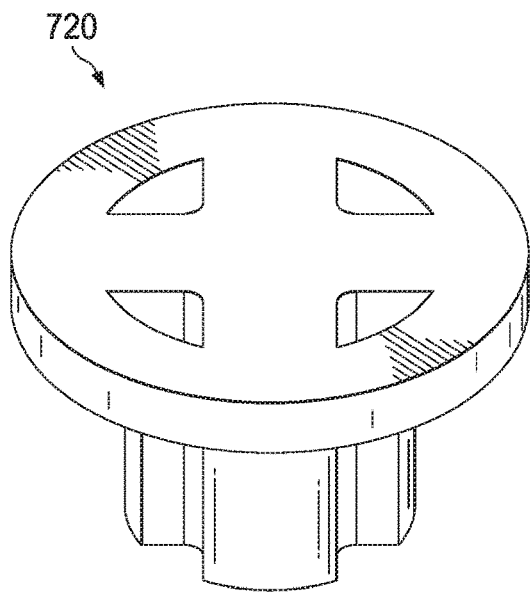

FIG. 7C shows a perspective view and FIG. 7D a top view of an example magnetic core 710 having an X-shaped wing flange with through notches. The through notches are for increasing the magnetic mold material flow during molding through from the top to the bottom of the magnetic core 710. FIG. 7E shows a perspective view and FIG. 7F a top view of an example magnetic core 720 having a flange and mold flow enhancing features comprising enclosed vertical notches in the flange and channels in the body. The magnetic volume example of the magnetic core 720 can be augmented somewhat by applying closing the magnetic core and just allowing the mold to flow top to bottom, instead of from the side of the flange. Channels in the core body can also aid with this.

Figure 7G:
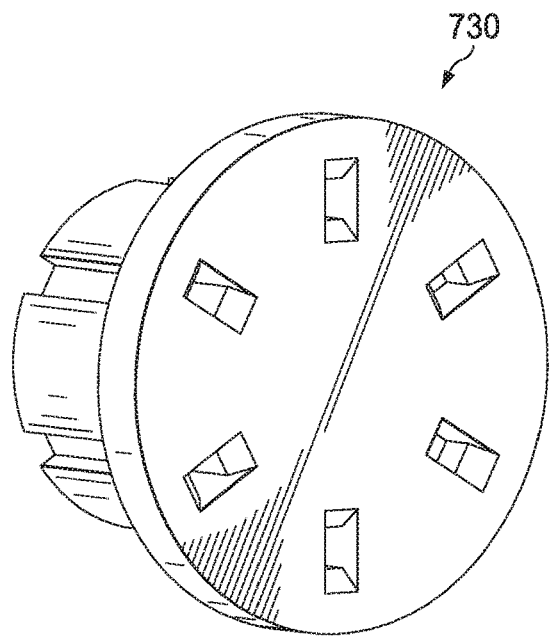
Figure 7F:
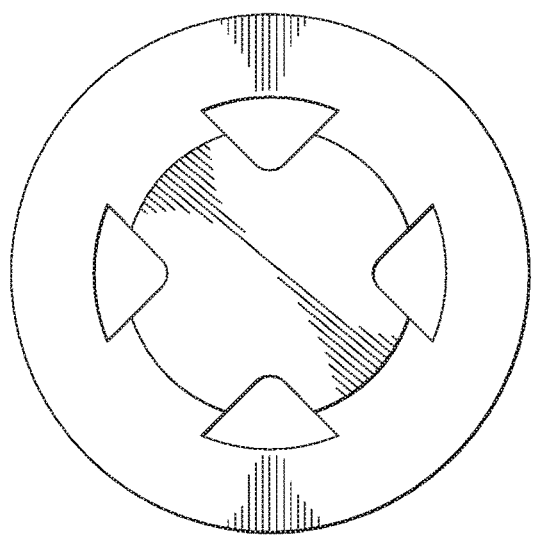
Figure 7H:
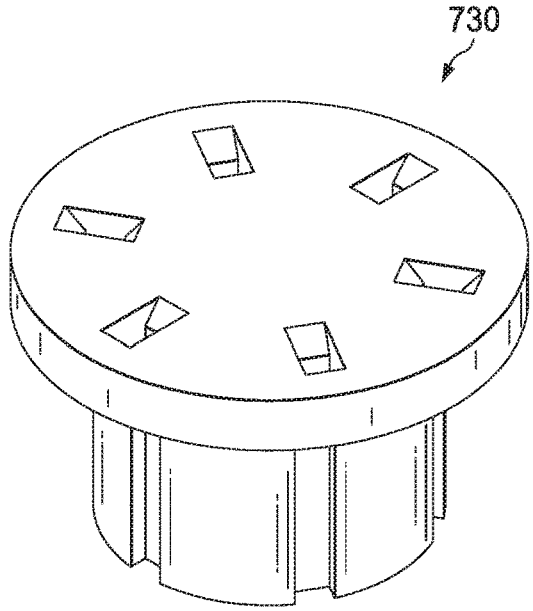

FIG. 7G shows a top skewed view, FIG. 7H a perspective view and FIG. 7I a top view of an example magnetic core 730 having a flange and mold flow enhancing features that comprise angled notches into the flange which are angled to guide the magnetic mold material through to the cavities created in the body. FIG. 7J shows a perspective view and FIG. 7K a top view of an example magnetic core 740 having mold flow enhancing features shown as side channels (or grooves) without a flange, that comprises the magnetic core 700 shown in FIGS. 7A and 7B without its flange. As with the magnetic core 700 shown in FIGS. 7A and 7B, the side channels (or grooves) are for guiding the magnetic mold material during molding into the region between the sidewalls of the magnetic core 740 and its winding 208 in the package to enhance mold flow through the coil center around the outside of the magnetic core 740.

Figure 7L:
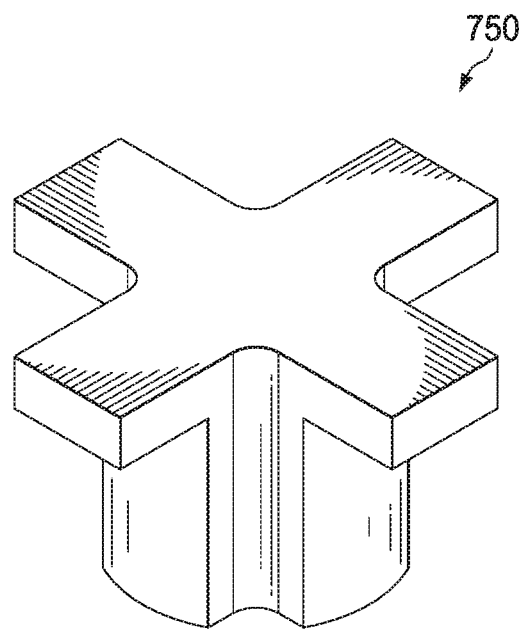
Figure 7M:
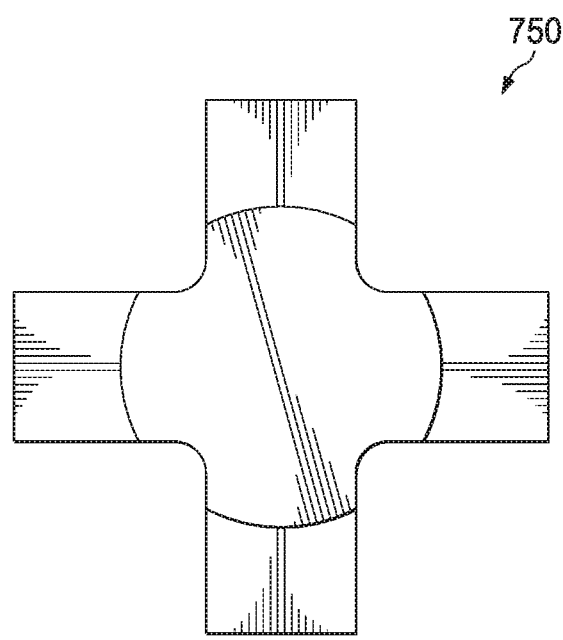

Any combination of the above-described magnetic mold flow path features can generally implemented. For example the channels as shown in FIG. 7A (or FIG. 7J) can be combined with the X-shaped wing flange. FIGS. 7L and 7M show a perspective view and a top view of a magnetic core 750, respectively, that combine an X-shaped wing flange shown in FIGS. 7C and 7D described above on a body region having channel or/grooves as shown in FIGS. 7A and 7B also described above.

Various assembly methods can be used to form disclosed magnetic cores. For example, these mold flow path features can be implemented in a hard mold tool that shapes a powdered material into a finished magnetic core form as described. Another method of implementation would be 3D printing. Still another method could be through an injection mold process whereby magnetic material is injected into a tooling that includes the mold flow enhancing features. Other methods of implementing can be used.

Disclosed aspects can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A molded inductor, comprising:
a winding having leads coupled to a package substrate;
a magnetic core having a channeled or grooved body disposed within the winding; and
a magnetic mold material encasing the winding and the magnetic core.

2. The molded inductor of claim 1, further comprising a flange on top of the body including enclosed notches in the flange configured so that magnetic mold material during molding can flow from the side of the flange through to a space around between an outside of the body and the winding.

3. The molded inductor of claim 1, wherein the magnetic core further comprises an X-shaped wing flange at one end of the magnetic core providing through notches for increased magnetic mold material flow during molding through from a top to a bottom of the flanged magnetic core.

4. The molded inductor of claim 1, further including a flange at one end of the channeled or grooved body, the flange including notches through the flange.

5. The molded inductor of claim 1, further comprising a flange on top of the body including angled notches in the flange which are angled to guide the magnetic mold material through to cavities created in the body.

6. The molded inductor of claim 4, wherein the notches in the flange are aligned with the channels or grooves in the body.

7. The molded inductor of claim 1, wherein the magnetic mold material completely encases the winding and the magnetic core.

8. A switch-mode power supply module, comprising:
a package substrate;
a molded inductor on the package substrate, comprising:
a winding having leads coupled to the package substrate, and
a magnetic core having a channeled or grooved cylindrical body disposed within the winding;
a power supply switching component attached to the package substrate, wherein the power supply switching component is configured to drive the winding, and
a magnetic mold material encasing the winding, the magnetic core, and the power supply switching component.

9. The switch-mode power supply module of claim 8, further comprising a winding leadframe, wherein the winding is attached to the winding leadframe, and the winding leadframe is affixed to the package substrate.

10. The switch-mode power supply module of claim 8, wherein a diameter of a top end of the magnetic core is greater than a diameter of a bottom end of the magnetic core.

11. The switch-mode power supply module of claim 8, wherein the package substrate comprises a leadframe.

12. The switch-mode power supply module of claim 8, further including a flange on top of the body including side flange channels configured so that the magnetic mold material during molding can flow through the flange to a space around between an outside of the magnetic core and the winding.

13. The switch-mode power supply module of claim 8, further including an X-shaped wing flange at one end of the body providing through notches for increasing a flow of the magnetic mold material flow during molding through from a top to a bottom of the magnetic core.

14. A method for manufacturing a switch-mode converter, comprising:
attaching a power supply switching component to a module substrate;
coiling a conductor to form a winding;
securing the winding to the module substrate;
inserting a channeled or grooved body of a magnetic core within the winding; and
encapsulating the power supply switching component, the winding, and the magnetic core in a magnetic mold material.

15. The method of claim 14, further comprising attaching the winding to a winding leadframe prior to the securing.

16. The method of claim 14, wherein the securing comprises attaching the winding to the module substrate.

17. The method of claim 14, wherein the power supply switching component is disposed between the module substrate and the winding.

18. The method of 14, wherein the molded inductor further comprises a flange on top of the body including enclosed notches in the flange configured so that magnetic mold material during molding can flow from the side of the flange through to the space around between an outside of the body and the winding.

19. The method of 14, further comprising forming the magnetic core by a process comprising cavity press molding.

20. The molded inductor of claim 1, wherein a winding leadframe couples the winding to the package substrate.

21. The molded inductor of claim 2, wherein the notches have at least three sides.

22. The molded inductor of claim 3, wherein the notches have at least three sides.

23. The molded inductor of claim 4, wherein the notches have at least three sides.

24. The switch-mode power supply module of claim 8, wherein the notches have at least three sides.

25. The method of claim 18, wherein the notches have at least three sides.

26. The method of claim 15, wherein the securing comprises attaching the winding leadframe—to the module substrate.

* * * * *